(12) United States Patent
Pagliato et al.

(10) Patent No.: US 6,657,895 B2
(45) Date of Patent: Dec. 2, 2003

(54) READING CIRCUIT AND METHOD FOR A MULTILEVEL NON-VOLATILE MEMORY

(75) Inventors: Mauro Pagliato, Bollate (IT); Paolo Rolandi, Voghera (IT); Massimo Montanaro, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/118,660

(22) Filed: Apr. 8, 2002

(65) Prior Publication Data

US 2002/0186592 A1 Dec. 12, 2002

(30) Foreign Application Priority Data

Apr. 10, 2001 (EP) .............................................. 01830248

(51) Int. Cl.[7] .............................................. G11C 16/00
(52) U.S. Cl. ............................. 365/185.21; 365/185.03
(58) Field of Search ...................... 365/185.21, 185.03, 365/189.07, 207

(56) References Cited

U.S. PATENT DOCUMENTS

| | | | | |
|---|---|---|---|---|
| 5,729,490 A | * | 3/1998 | Calligaro et al. | 365/185.03 |
| 5,828,616 A | | 10/1998 | Bauer et al. | 365/210 |
| 6,069,821 A | * | 5/2000 | Jun et al. | 365/185.21 |
| 6,473,340 B1 | * | 10/2002 | Pasotti et al. | 365/185.21 |

OTHER PUBLICATIONS

Calligaro, C. et al., "Dichotomic Current–Mode Serial Sensing Methodology for Multistorage Non–Volatile Memories," in *Proceedings of the 38th Midwest Symposium on Circuits and Systems*, Rio de Janeiro, Aug. 13–16, 1995, pp.302–305.

* cited by examiner

Primary Examiner—Tan T. Nguyen
(74) *Attorney, Agent, or Firm*—Lisa K. Jorgenson; E. Russell Tarleton; Seed IP Law Group

(57) ABSTRACT

Described herein is an asynchronous serial dichotomic sense amplifier comprising a first comparator stage having a first input receiving the cell current flowing in the multilevel memory cell, the content of which is to be read, a second input receiving a first reference current, and an output supplying the first of the bits stored in the multilevel memory cell; a multiplexer stage having a selection input connected to the output of the first comparator stage, a first signal input receiving a second reference current, a second signal input receiving a third reference current, and a signal output selectively connectable to the first or the second signal input depending on the logic level present on the selection input; and a second comparator stage having a first input receiving the cell current, a second input connected to the signal output of the multiplexer stage, and an output supplying the second of the bits stored in the multilevel memory cell.

15 Claims, 6 Drawing Sheets

READING CIRCUIT AND METHOD FOR A MULTILEVEL NON-VOLATILE MEMORY

BACKGROUND OF THE INVENTION

1. Field of the Invention

The present invention relates to a reading circuit and method for a multilevel non-volatile memory.

2. Description of the Related Art

As is known, in floating-gate non-volatile memory cells, storage of a logic state is performed by programming the threshold voltage of the memory cells themselves through the definition of the amount of electrical charge stored in the floating-gate region.

Although they are based on the same principle, writing and reading of two-level memory cells, that is which are able to store only one bit, and of multilevel memory cells, that is which are able to store n bits, take place in different ways.

In particular, depending on the information stored, two-level memory cells are distinguished into erased memory cells (stored logic value "1"), in which no electric charge is stored in the floating-gate region, and written or programmed memory cells (stored logic value "0"), in which an electric charge sufficient to determine a considerable increase of the threshold voltage of the memory cells themselves is stored in the floating-gate region.

Reading of two-level memory cells is carried out by comparing an electric quantity correlated to the current flowing through the memory cells with a similar electric quantity correlated to the current flowing through a reference memory cell with a known content. In particular, to carry out reading of a two-level memory cell, a read voltage with a value between the threshold voltage of an erased memory cell and the threshold voltage of a written memory cell is supplied to the gate terminal of the memory cell itself, in such a way that, if the memory cell is written, the read voltage is lower than its threshold voltage, and thus no current flows in the memory cell; whereas, if the memory cell is erased, the read voltage is higher than its threshold voltage, and thus current flows in the memory cell.

In multilevel memory cells, storage of data of n bits, on the other hand, requires programming of threshold voltages which can assume $2^n$ different values, with each of which is associated a corresponding datum of n bits, while reading of multilevel memory cells is carried out by comparing an electric quantity correlated to the current flowing through the memory cells themselves with $2^n$ distinct reference intervals, with each of which is associated a corresponding datum of n bits, and then determining the datum associated with the interval of values within which said electric quantity is included.

FIG. 1 shows, as an example, a graph representing the current flowing in a two-bit memory cell and the reference currents which define the reference intervals used for reading the content of the memory cell.

In particular, in FIG. 1 the short-dashes line represents the current $I_{CELL}$ flowing in a memory cell, the content of which is composed of "10" bits continuous line represents the three reference currents $I_{REF1}$, $I_{REF2}$, $I_{REF3}$ which define the four reference intervals. In FIG. 1 there are also indicated the two bits associated with each of the four reference intervals and, with a dash-dot line, the current flowing in a virgin cell which, as is known, is higher than the highest reference current ($I_{REF3}$)

It is also known that reading of a memory cell is carried out by means of a reading circuit generally known as "sense amplifier" (a term also used in this presentation) which, in addition to recognizing the logic state stored in the memory cell, also provides for the correct biasing of the drain terminal of the memory cell.

For reading multilevel memory cells, essentially two types of sense amplifiers are used: the so-called parallel or flash sense amplifiers, and the so-called synchronous serial dichotomic or successive approximation sense amplifiers.

FIG. 2 shows, as an example, the circuit architecture of a known parallel sense amplifier for reading a two-bit memory cell.

In particular, in parallel sense amplifiers reading of the content of the memory cell is carried out by comparing the cell current $I_{CELL}$ simultaneously with the three reference currents $I_{REF1}$, $I_{REF2}$, $I_{REF3}$ using three distinct comparator stages 1 operating in parallel, one for each reference current, the outputs of which are connected to a decoding stage 2 which supplies the two bits stored in the memory cell to be read, depending on the logic level assumed by the outputs of the comparator stages.

FIG. 3 schematically represents the dichotomic algorithm implemented by the synchronous serial dichotomic sense amplifiers for reading the content of a two-bit memory cell, while FIG. 4 shows the circuit architecture of a known synchronous serial dichotomic sense amplifier.

In particular, as shown in FIG. 3, in synchronous serial dichotomic sense amplifiers reading of the content of the memory cell, in the example shown still composed of "10" bits, is carried out in two temporally successive steps, called dichotomic, one for each of the two bits to be read, in which, in the first dichotomic step, the cell current $I_{CELL}$ flowing in the memory cell is compared with the reference current $I_{REF2}$, the value of which is intermediate between those assumed by the other reference currents, while in the second dichotomic step the cell current $I_{CELL}$ flowing in the memory cell is compared with the reference current $I_{REF1}$ or $I_{REF3}$, depending on the outcome of the comparison carried out in the first dichotomic step. In particular, if in the first dichotomic step the cell current $I_{CELL}$ is higher than the reference current $I_{REF2}$, then in the second dichotomic step the cell current $I_{CELL}$ is compared with the reference current $I_{REF3}$, while if in the first dichotomic step the cell current $I_{CELL}$ is lower than the reference current $I_{REF2}$, then in the second dichotomic step the cell current $I_{CELL}$ is compared with the reference current $I_{REF1}$.

In each dichotomic step one of the two bits is then decoded; in particular, in the first dichotomic step the most significant bit (MSB) is decoded, while in the second dichotomic step the least significant bit (LSB) is decoded.

As shown in FIG. 4, in synchronous serial dichotomic sense amplifiers reading of the content of the memory cell is carried out using a single comparator stage 3 which in the first dichotomic step compares the cell current $I_{CELL}$ with the reference current $I_{REF2}$, while in the second dichotomic step it compares the cell current $I_{CELL}$ with the reference current $I_{REF1}$ or $I_{REF3}$, depending on the outcome of the comparison made in the first dichotomic step.

In particular, the selection of the reference current $I_{REF1}$, $I_{REF2}$ or $I_{REF3}$ with which the cell current $I_{CELL}$ is compared is made with a multiplexer stage 4 controlled by a control circuit 5, which is also connected to two registers 6 or "latches" in which the two read bits are stored.

Although widely used, parallel sense amplifiers and synchronous serial dichotomic sense amplifiers present certain inconveniences which do not allow all their good points to be adequately exploited.

First of all, both parallel sense amplifiers and synchronous serial dichotomic sense amplifiers present a high area occupation on silicon. In fact, parallel sense amplifiers require the provision of a comparator stage for each bit stored in the memory cells which, as is known, presents an area occupation that is not negligible, so that the use of this type of sense amplifiers is no longer advisable as the number of bits stored in the memory cells increases.

Although synchronous serial dichotomic sense amplifiers use only one comparator stage, they require the provision of registers for storing the bits read in each dichotomic step, of a multiplexer stage, and of a control stage. Moreover, this type of sense amplifier requires an accurate management of the various dichotomic steps, and so the circuit complexity of the control stage, and therefore its area occupation on silicon, increases significantly as the number of bits stored in the memory cells increases.

Furthermore, in synchronous serial dichotomic sense amplifiers the various dichotomic steps all present the same duration which is established a priori for the so-called worst case, that is to allow the reliable reading of a bit even when all the operating conditions that determine a slowing down of the reading (low supply voltage, high capacities to be load/unload, etc.) occur simultaneously, and are synchronized with each other, that is a dichotomic step starts after a pre-set time interval from the start of the previous dichotomic step, independently of the instant in which the first comparator stage has actually ended the comparison between the cell current $I_{CELL}$ and the reference current $I_{REF2}$.

For these reasons, therefore, reading speed of synchronous serial dichotomic sense amplifiers is not very high, in particular the overall time necessary to read the content of a non-volatile memory cell assumes on average, in this type of sense amplifier, rather high values of around 20–25 ns which, in some applications, are not acceptable.

BRIEF SUMMARY OF THE INVENTION

The disclosed embodiments of the present invention is to provide a reading circuit and a method for a multilevel non-volatile memory which allow a better combination, with respect to the known reading circuits described above, of the contrasting needs of reduced area occupation and high reading speed.

In accordance with one embodiment of the invention, a reading circuit for a non-volatile memory is provided that includes an asynchronous serial dichotomic reading circuit. Ideally, the asynchronous serial dichotomic reading circuit includes a first comparator receiving an electric quantity correlated to the current flowing in a multi-level memory and receiving an electric quantity correlated to a first reference current and outputting one of the bits stored in the multi-level memory cells; a selection circuit receiving the output from the first comparator and receiving an electric quantity correlated to a second reference current and an electric quantity correlated to a third reference current and outputting a signal selectively connectable to one of the first and second inputs depending on the logic level present on a selection input to the selection circuit; and a second comparator circuit receiving an electric quantity correlated to the current flowing in the multi-level memory cell and receiving at a second input the signal output from the selection circuit, and configured to supply another of the bits stored in the multi-level memory cell.

In accordance with another aspect of the foregoing embodiment, the selection circuit includes a first switch arranged between a first signal input and a signal output, the first switch having a control terminal connected to the selection input and a second switch arranged between a second signal input and a signal output and having a control terminal connected to the selection input through an inverter, the inverter having an input connected to the selection input and an output connected to the control terminal of the second switch.

BRIEF DESCRIPTION OF THE SEVERAL VIEWS OF THE DRAWING(S)

For a better understanding of the present invention, a preferred embodiment is now described, purely as an example without limitation, with reference to the enclosed drawings, in which.

Figures 3, 4:
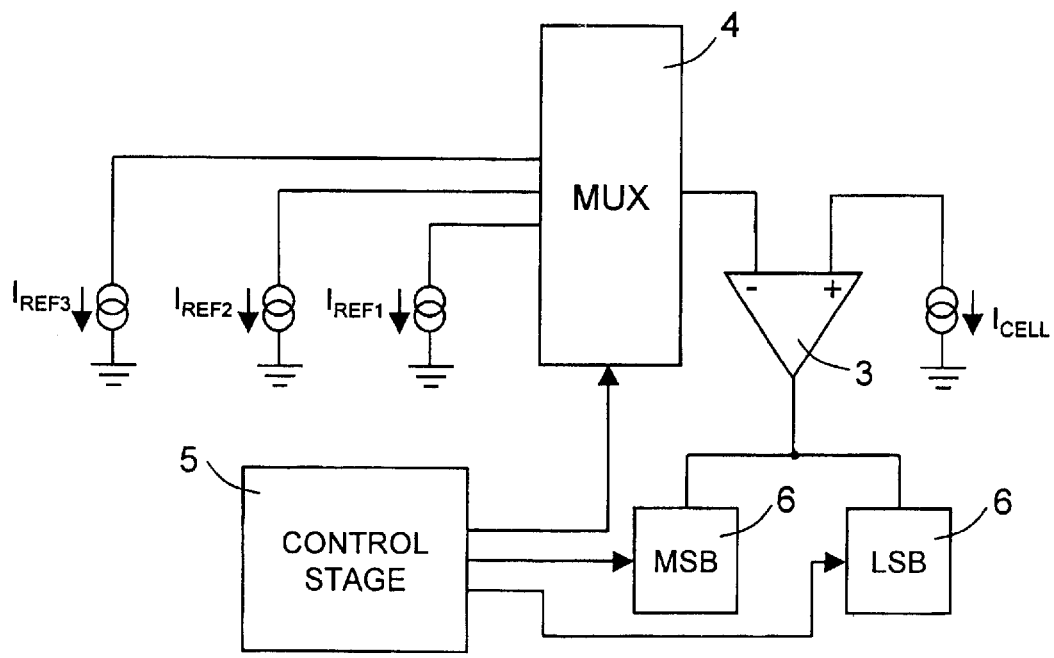
Figure 5:
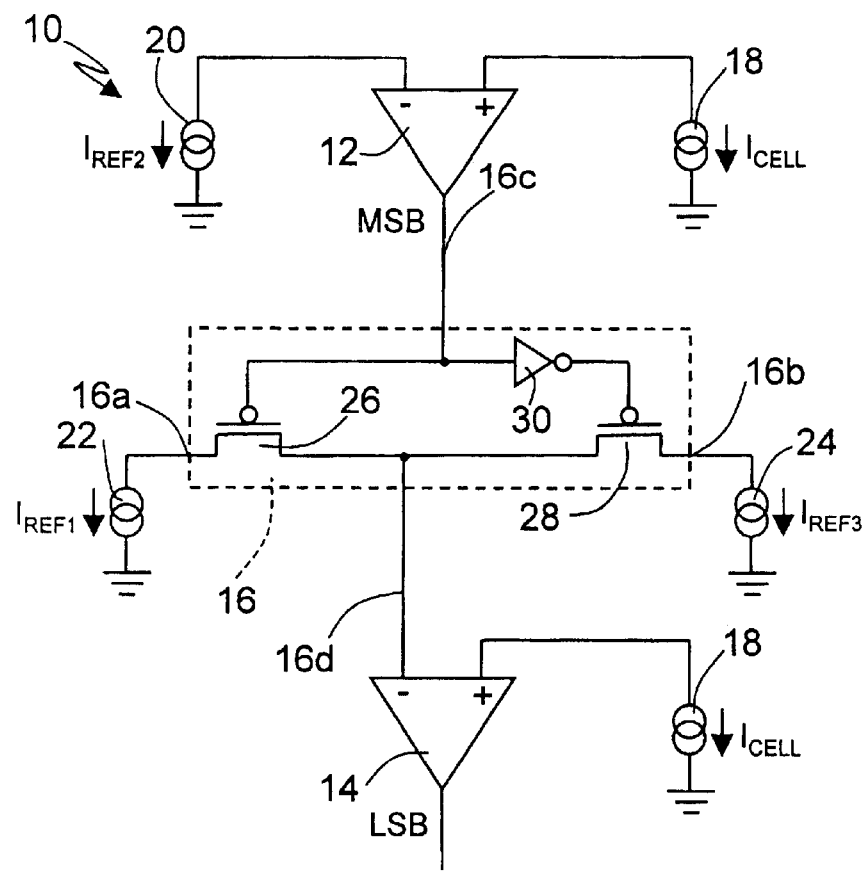
Figure 7:
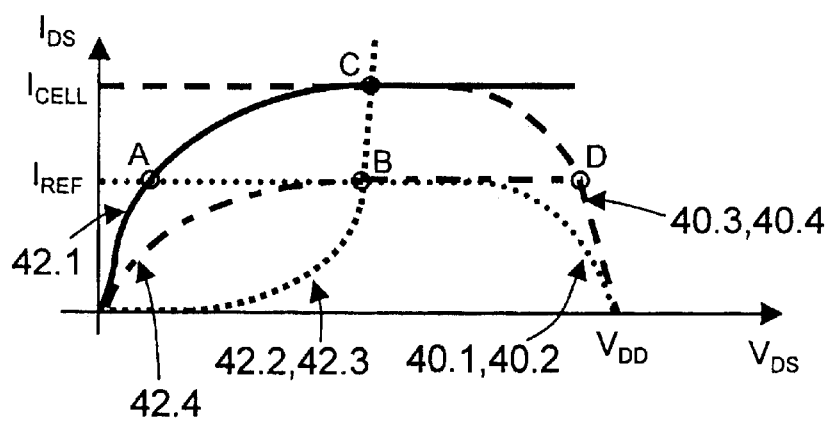
Figure 6:
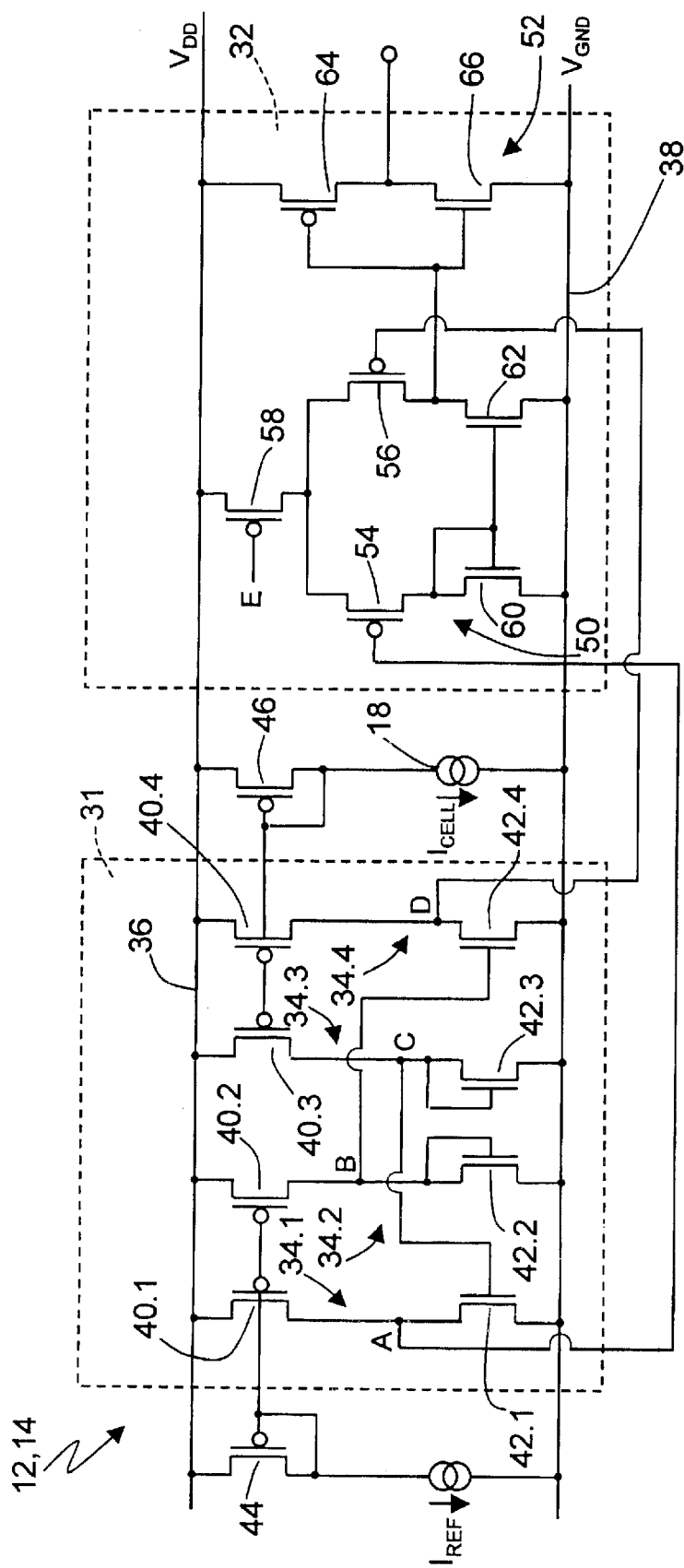
Figure 8:
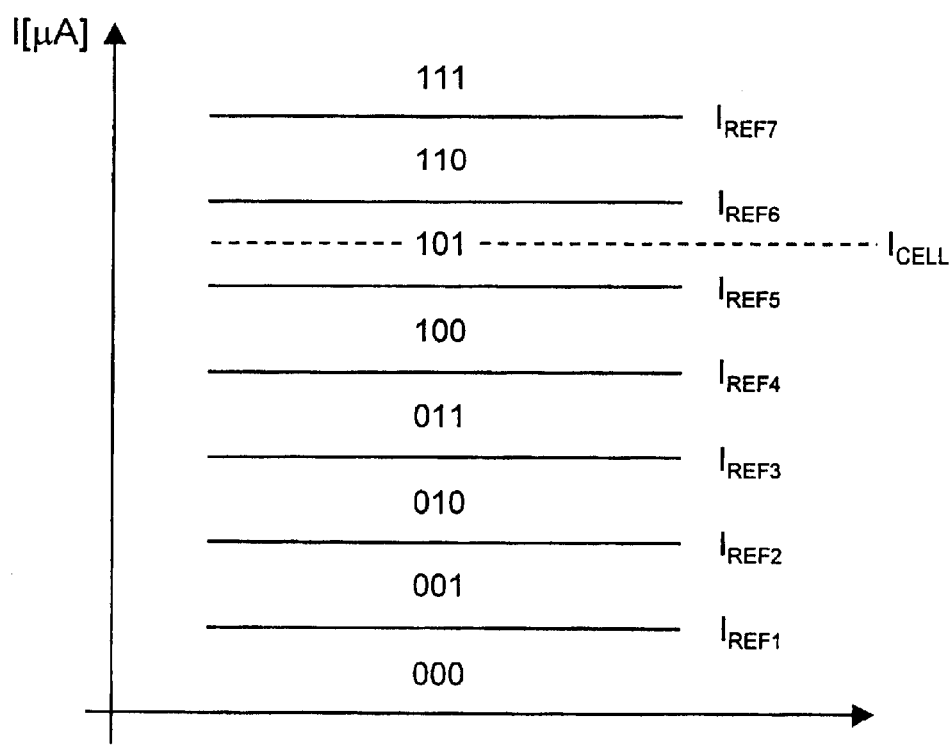
Figure 9:
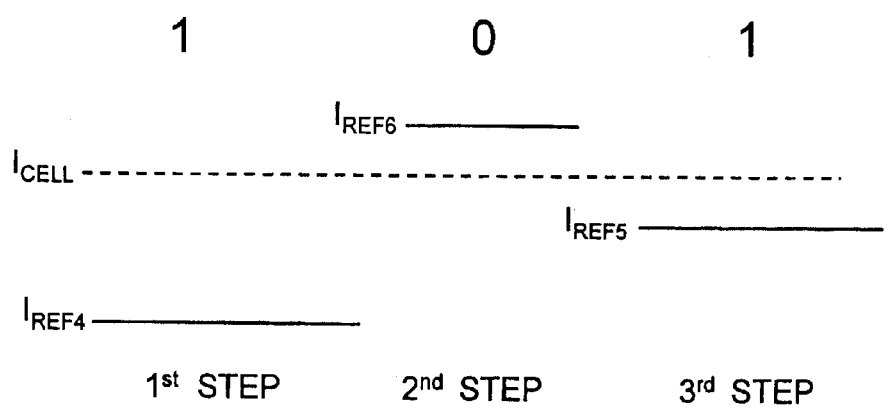
Figure 10:
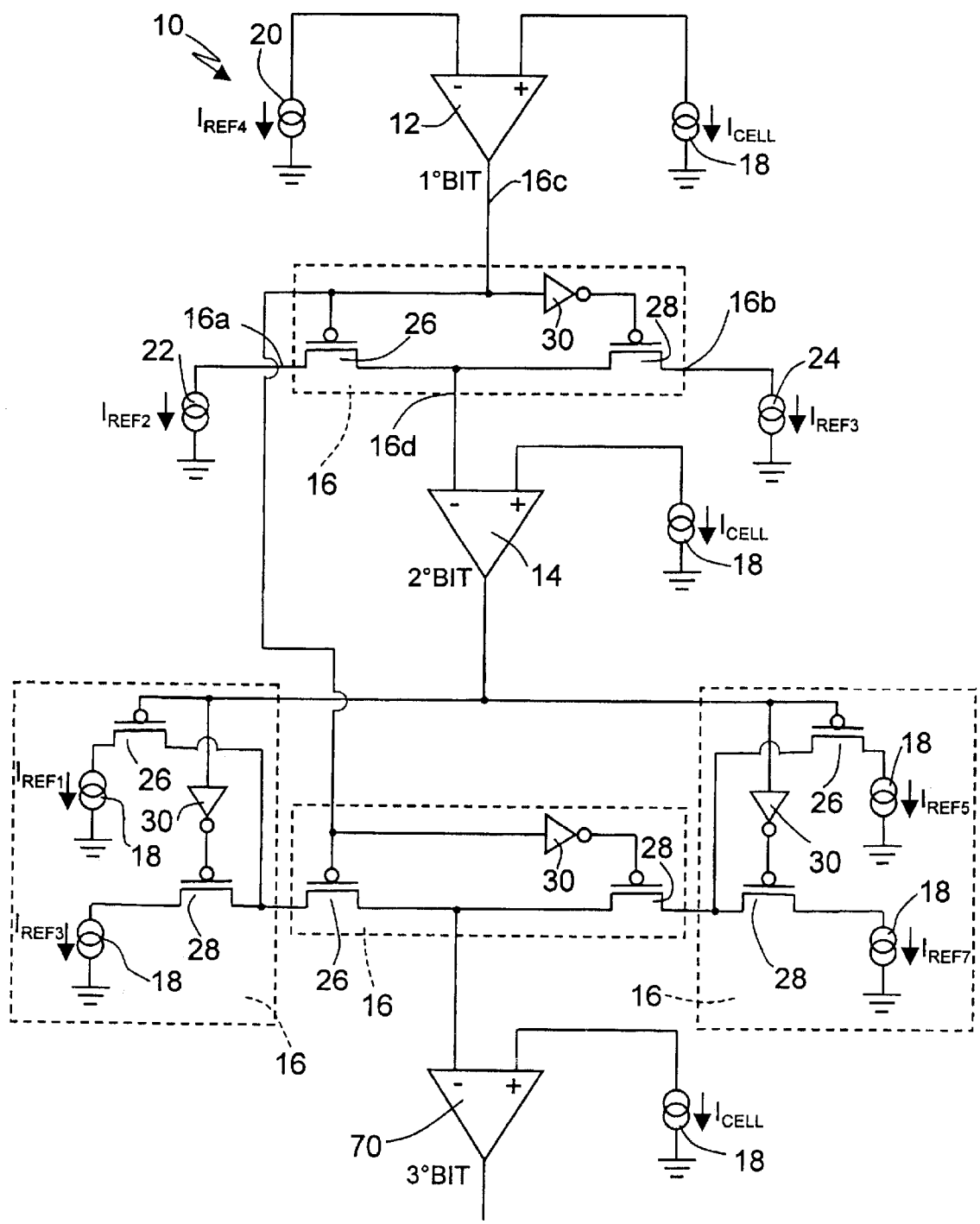

FIG. 3 schematically shows the dichotomic algorithm for reading the content of a two-bit memory cell;

FIG. 4 shows the circuit architecture of a known synchronous serial dichotomic sense amplifier for reading the content of a two-bit memory cell;

FIG. 5 shows the circuit architecture of an asynchronous serial dichotomic sense amplifier according to the present invention for reading the content of a two-bit memory cell;

FIG. 6 shows the circuit diagram of a comparator stage forming part of the sense amplifier according to the present invention;

FIG. 7 shows current-voltage characteristics and the corresponding work points of branches of a double current mirror with a symmetrical active load forming part of the sense amplifier according to the present invention;

FIG. 8 is a graph representing the reference currents that define the intervals of values used for reading the content of a three-bit memory cell;

FIG. 9 schematically shows the dichotomic algorithm for reading the content of a three-bit memory cell; and FIG. 10 shows the circuit architecture of an asynchronous serial dichotomic sense amplifier according to the present invention for reading the content of a three-bit memory cell.

DETAILED DESCRIPTION OF THE INVENTION

FIG. 5 shows the circuit architecture of a sense amplifier according to the present invention for reading the content of a two-bit memory cell.

The sense amplifier, indicated as a whole by 10, presents a circuit architecture designed to implement an asynchronous serial dichotomic algorithm, and comprises a first and a second comparator stage 12, 14, and a two-way multiplexer stage 16 for selecting the reference current with which the cell current is compared in the second dichotomic step.

In particular, the first comparator stage 12 has a non inverting input connected to the memory cell to be read, schematically represented in the Figure with a first current generator 18, and receiving the cell current $I_{CELL}$ flowing in the memory cell itself, an inverting input connected to a second current generator 20 supplying a reference current $I_{REF2}$, and an output whose logic level represents the most significant bit (MSB) stored in the memory cell. In particular, the output of the first comparator stage 12 assumes a high logic level if the cell current $I_{CELL}$ is higher than the reference current $I_{REF2}$, and a low logic level if the cell current $I_{CELL}$ is lower than the reference current $I_{REF2}$.

The multiplexer stage 16 has a first and a second signal input 16a, 16b connected to a third current generator 22 supplying a reference current $I_{REF1}$ and, respectively, to a fourth current generator 24 supplying a reference current $I_{REF3}$, a selection input 16c connected to the output of the first comparator stage 12, and a signal output 16d selectively connectable to the first or the second signal input 16a, 16b of the multiplexer stage 16 depending on the logic level assumed by the output of the first comparator stage 12.

The second comparator stage 14 has a non inverting input connected to the memory cell 18 to be read, and receiving the cell current $I_{CELL}$ flowing in the memory cell 18 itself; an inverting input connected to the signal output 16d of the multiplexer stage 16, and an output whose logic level represents the least significant bit (LSB) stored in the memory cell 18 itself.

The multiplexer stage 16 is formed by a first and a second PMOS pass transistor 26, 28, and by a logic inverter 30. In particular, the first pass transistor 26 has a source terminal connected to the first signal input 16a, a drain terminal connected to the signal output 16d, and a gate terminal connected to the selection input 16c, while the second pass transistor 28 has a source terminal connected to the second signal input 16b, a drain terminal connected to the signal output 16d, and a gate terminal connected to the selection input 16c through the logic inverter 30, the input of which is connected to the selection input 16c and the output of which is connected to the gate terminal of the second pass transistor 28.

Figure 1:
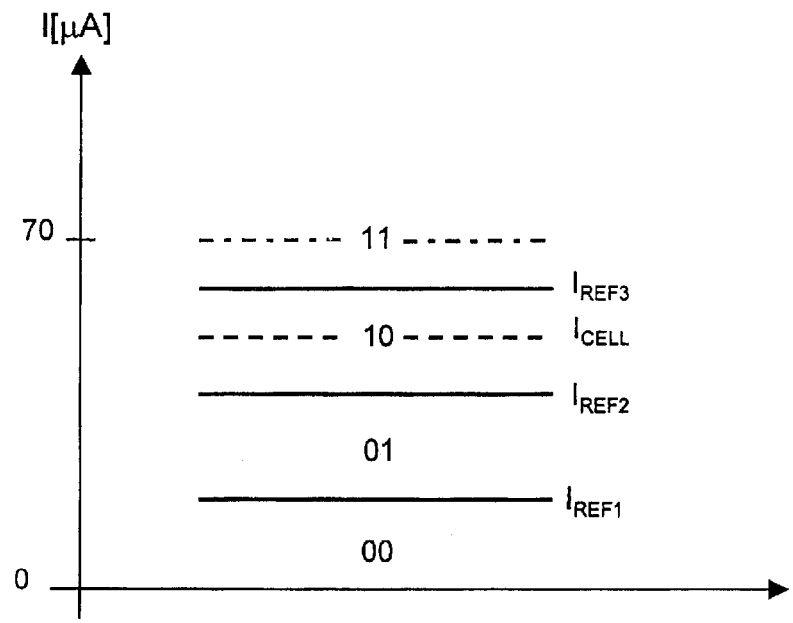
FIG. 1 is a graph representing the reference currents that define the intervals of values used for reading the content of a two-bit memory cell.
Figure 2:
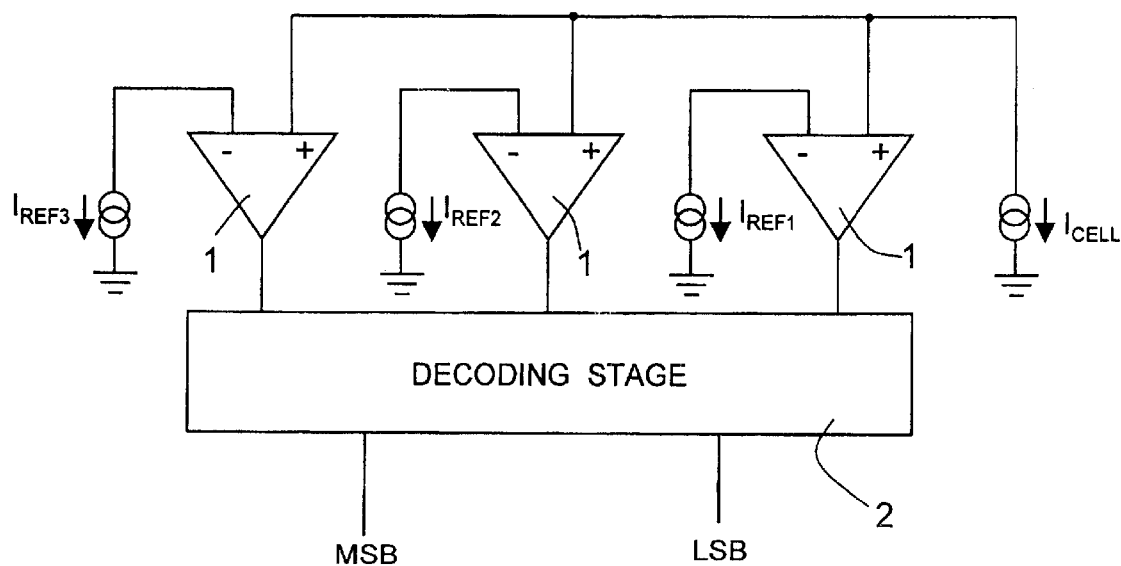
FIG. 2 shows the circuit architecture of a known parallel sense amplifier for reading the content of a two-bit memory cell.

The reference currents $I_{REF1}$, $I_{REF2}$, $I_{REF3}$ assume the same values indicated in FIG. 1, that is the reference current $I_{REF2}$ assumes an intermediate value between that assumed by the reference current $I_{REF1}$, which is the lowest, and that assumed by the reference current $I_{REF3}$, which is the highest, and the three reference currents $I_{REF1}$, $I_{REF2}$, $I_{REF3}$ define the four reference intervals used for reading the content of the memory cell to be read.

Moreover, the output of the second comparator stage 14 assumes a high logic level if the cell current $I_{CELL}$ is higher than the reference current $I_{REF1}$ or than the reference current $I_{REF3}$, depending on which of the pass transistors 26, 28 is on, and a low logic level if the cell current $I_{CELL}$ is lower than the reference current $I_{REF1}$ or $I_{REF3}$.

The reading of the content of the memory cell is carried out in two dichotomic steps in a similar way to the one previously described for synchronous serial dichotomic sense amplifiers, except for the fact that the two dichotomic steps are asynchronous with each other.

In particular, in the first dichotomic step the cell current $I_{CELL}$ is compared with the reference current $I_{REF2}$, while in the second dichotomic step the cell current $I_{CELL}$ is compared with the reference current $I_{REF1}$ if the cell current $I_{CELL}$ is lower than the reference current $I_{REF2}$, or with the reference current $I_{REF3}$ if the cell current $I_{CELL}$ is higher than the reference current $I_{REF2}$.

In fact, if at the end of the first dichotomic step the output of the first comparator stage 12 assumes a low logic level, then the first pass transistor 26 is on, while the second pass transistor 28 is off, so the inverting input of the second comparator stage 14 is connected to the third current generator 22, and hence the second comparator stage 14 carries out a comparison between the cell current $I_{CELL}$ and the reference current $I_{REF1}$. If on the contrary at the end of the first dichotomic step the output of the first comparator stage 12 assumes a high logic level, then the first pass transistor 26 is off, while the second pass transistor 28 is on, so the inverting input of the second comparator stage 14 is connected to the fourth current generator 24, and hence the second comparator stage 14 carries out a comparison between the cell current $I_{CELL}$ and the reference current $I_{REF3}$.

In each dichotomic step one of the two bits is then decoded; in particular, in the first dichotomic step the most significant bit (MSB) is decoded, while in the second dichotomic step the least significant bit (LSB) is decoded.

Contrary to what happens in synchronous serial dichotomic sense amplifiers described above, the two dichotomic steps realized by the sense amplifier according to the present invention are asynchronous with each other.

In particular, in the sense amplifier 10 according to the present invention the second dichotomic step starts as soon as the first comparator stage 12 has completed the comparison between the cell current $I_{CELL}$ and the reference current $I_{REF2}$, contrary to what happens in synchronous serial dichotomic sense amplifiers in which, since the duration of each dichotomic step is established a priori for the worst case, the second dichotomic step starts after a pre-set interval from the start of the first dichotomic step, independently of the instant in which the first comparator stage 12 completed the comparison between the cell current $I_{CELL}$ and the reference current $I_{REF2}$.

This makes it possible to obtain a significant reduction of the reading time with respect to the synchronous serial dichotomic sense amplifiers, since the first dichotomic step ends exactly at the moment in which the first comparator stage 12 completes the comparison between the cell current $I_{CELL}$ and the reference current $I_{REF2}$.

In fact, the mean reading time necessary to read the content of a two-bit memory cell is reduced from 70 ns for a synchronous serial dichotomic sense amplifier to 50 ns. It may be immediately understood how the benefits in terms of reduction of the reading time become more and more significant with respect to synchronous serial dichotomic sense amplifiers, the higher the number of bits stored in the memory cells.

Not only, but an asynchronous configuration, using a comparator stage for each dichotomic step, also allows a saving in the area on silicon which, in a synchronous configuration, is occupied by the control circuit and by the registers.

Finally, FIG. 6 shows the circuit diagram with which the comparator stages 12, 14 of the sense amplifier 10 according to the present invention may be conveniently realized.

In particular, as shown in FIG. 6, each comparator stage 12, 14 is formed by a double input current mirror 31 with a symmetrical active load, and by an output voltage comparator 32 cascade-connected between a supply line 36 set at a supply voltage $V_{DD}$, and a ground line 38 set at a ground voltage $V_{GND}$.

In particular, the double current mirror 31 with a symmetrical active load allows the mirroring of the two currents supplied to the inputs of the comparator stage 12, 14 on a balanced active load with high impedance and formed by four branches, indicated respectively with 34.1–34.4, parallel-connected between the supply line 36 and the ground line 38, and each formed by a PMOS transistor, indicated respectively with 40.1, 40.2, 40.3, 40.4, and by a NMOS transistor, indicated respectively with 42.1, 42.2, 42.3, 42.4, series-connected.

In particular, the PMOS transistors 40.1, 40.2 have source terminals connected to the supply line 36, drain terminals connected respectively to the drain terminal of the respective NMOS transistors 42.1, 42.2, and gate terminals connected to each other. The drain terminals of the PMOS and NMOS transistors 40.1, 42.1 further define a first output node of the double current mirror 31.

The NMOS transistor 42.1 has a source terminal connected to the ground line 38, and a gate terminal connected to the gate terminal of the NMOS transistor 42.3, while the NMOS transistor 42.2 is diode-connected and has a source terminal connected to the ground line 38, and a gate terminal connected to its own drain terminal and to the gate terminal of the NMOS transistor 42.4.

The gate terminals of the PMOS transistors 40.1, 40.2 are further connected to the gate terminal of a PMOS transistor 44, which is diode-connected and has a source terminal connected to the supply line 36, and a drain terminal connected to its own gate terminal and defining the inverting input of the comparator stage 12, 14, to which one of the reference currents $I_{REF1}$, $I_{REF2}$, $I_{REF3}$ (indicated in the figure generally as $I_{REF}$) is supplied.

The PMOS transistors 40.3, 40.4 have source terminals connected to the supply line 36, drain terminals connected respectively to the drain terminal of the respective NMOS transistors 42.3, 42.4, and gate terminals connected to each other. The drain terminals of the PMOS and NMOS transistors 40.4, 42.4 further define a second output node of the double current mirror 31.

The NMOS transistor 42.3 is diode-connected and has a source terminal connected to the ground line 38, and a gate terminal connected to its own drain terminal and to the gate terminal of the NMOS transistor 42.1, while the NMOS transistor 42.4 has a source terminal connected to the ground line 38, and a gate terminal connected to the gate terminal of the NMOS transistor 42.2.

The gate terminals of the PMOS transistors 40.3, 40.4 are further connected to the gate terminal of a PMOS transistor 46, which is diode-connected and has a source terminal connected to the supply line 36, and a drain terminal connected to its own gate terminal and defining the non inverting input of the comparator stage 12, 14, to which the cell current $I_{CELL}$ is supplied.

The voltage comparator 32 is formed by a differential input stage 50, and by an output stage 52 cascade-connected between the supply line 36 and the ground line 38.

In particular, the input stage 50 of the voltage comparator 32 is formed by three PMOS transistors 54, 56, 58, and by a pair of NMOS transistors 60, 62 connected as a current mirror.

In detail, the PMOS transistors 54, 56 have source terminals connected to each other and to the supply line 36 through the PMOS transistor 58, gate terminals connected to the first and, respectively, to the second output node of the double current mirror 31, and drain terminals connected respectively to the drain terminals of the NMOS transistors 60, 62, which in turn have source terminals connected to the ground line 38, and gate terminals connected to each other and to the drain terminal of the NMOS transistor 60.

Moreover, the PMOS transistor 58 has a source terminal connected to the supply line 36, a drain terminal connected to the source terminals of the PMOS transistors 54, 56, and a gate terminal receiving an enabling signal E.

The output stage 52 of the voltage comparator 32 is essentially composed of a logic inverter formed by a PMOS transistor 64 and a NMOS transistor 66 having gate terminals connected to each other and to the drain terminal of the NMOS transistor 62 of the input stage 52, source terminals connected to the supply line 36 and, respectively, to the ground line 38, and drain terminals connected to each other and defining the output of the comparator stage 12, 14.

The operation of the comparator stage 12, 14 shown in FIG. 6 is on the whole similar to that of a traditional single current mirror with an asymmetrical active load, so it will not be described in detail.

There is only stressed the fact that the use of a double current mirror with a symmetrical active load allows a significant increase of the dynamic of the output voltage of the voltage comparator with respect to a configuration with a single current mirror. In fact, a circuit configuration with a double current mirror with a symmetrical active load allows even a very small current difference to be converted into an appreciable voltage difference, which is then supplied to the input of the voltage comparator to further increase the dynamic of the signal at input to the output inverter (CMOS signal).

Although the circuit configuration with a double current mirror with a symmetrical active load has a current consumption slightly higher than that of a configuration with a single current mirror, it has the advantage of allowing a significant reduction of the cross conduction current of the output inverter, which is controlled with full dynamic even when the currents supplied to the input of the comparator stage differ by even just a few $\mu A$.

This increase of the voltage dynamic with which the voltage comparator is controlled is clear from the analysis of FIG. 7, in which the voltage-current characteristics of each of the transistors 40.1–40.4 and 42.1–42.4 of the four branches 34.1–34.4 of the double current mirror 31 are represented, and in which the work points of the four branches 34.1–34.4 are indicated respectively with A, B, C, D.

The advantages of the sense amplifier according to the present invention are clear from the previous description.

Lastly it is clear that modifications and variations may be made to the sense amplifier herein described and illustrated without departing from the scope of the present invention, as defined by the enclosed claims.

In particular, it is stressed that all that has been described above with reference to the asynchronous serial dichotomic reading of the content of a two-bit memory cell may be immediately extended to the asynchronous serial dichotomic reading of the content of an n-bit memory cell. In the general case of the reading of n bits, in fact, the sense amplifier will comprise n comparator stages of the type described above, one for each of the bits stored in the memory cell: the comparator stage that performs the first dichotomic step will receive, on its own non inverting input, the cell current and, on its own inverting input, the intermediate reference current, while the other comparator stages will receive, on their own non inverting input, the cell current and, on their own inverting input, a respective reference current chosen from a pair of reference currents by a multiplexer stage controlled by the comparator stage which carries out the comparison in the previous dichotomic step.

As an example, FIG. 8 shows a graph representing the current flowing in a three-bit memory cell and the seven reference currents that define the eight reference intervals used for reading the content of the memory cell; FIG. 9 schematically shows the dichotomic algorithm for reading the content of a three-bit memory cell; and FIG. 10 shows the circuit architecture of a synchronous serial dichotomic sense amplifier according to the present invention for reading the content of a three-bit memory cell.

In particular, in FIG. 8 a short-dashes line represents the cell current $I_{CELL}$ flowing in a memory cell, the content of which is composed of "101" bits, and a continuous line represents the seven reference currents $I_{REF1}$–$I_{REF7}$ which define the eight reference intervals used for reading the content of the memory cell. FIG. 8 also shows the three bits associated with each of the eight reference intervals.

As may be seen instead in FIG. 9, the reading of the content of the memory cell, in the shown example still composed of "101" bits, is carried out in three dichotomic steps, in which in the first step the cell current $I_{CELL}$ is compared with the reference current $I_{REF4}$ having an intermediate value among the values of the seven reference currents $I_{REF1}$–$I_{REF7}$, in the second step the cell current $I_{CELL}$ is compared with the reference current $I_{REF6}$ having an intermediate value among the values of the three reference currents $I_{REF5}$, $I_{REF6}$, $I_{REF7}$ which are higher than the reference current $I_{REF4}$, and in the third step the cell current $I_{CELL}$ is compared with the reference current $I_{REF5}$.

Lastly, as may be seen in FIG. 10, the circuit architecture of a synchronous serial dichotomic sense amplifier for reading the content of a three-bit memory cell may be obtained immediately from the circuit architecture of the sense amplifier shown in FIG. 5.

In particular, in the sense amplifier shown in FIG. 10, designated as a whole by 10', the circuit structure which performs the first two dichotomic steps is exactly identical to that of the sense amplifier shown in FIG. 5, so it will not be described again, while the circuit structure which performs the third dichotomic step may be derived immediately from the one that performs the second dichotomic step.

In fact, as may be noted on observing FIG. 8, depending on the outcome of the second dichotomic step, in which the cell current $I_{CELL}$ is compared either with the reference current $I_{REF6}$, as in the example shown, or with the reference current $I_{REF2}$, in the third dichotomic step the cell current $I_{CELL}$ is to be compared either with one of the two reference currents $I_{REF5}$ and $I_{REF7}$, as in the example shown, or with one of the two reference currents $I_{REF1}$ and $I_{REF3}$.

So as may be seen in FIG. 10, the circuit structure which performs the third dichotomic step comprises a comparator stage 70 receiving, on its own non inverting input, the cell current $I_{CELL}$, and, on its own inverting input, a reference current.

In the reading of one of the three-bit memories, in the third dichotomic step the selection of which reference current is to be supplied to the comparator stage 70 requires first of all the choice of which of the two pairs of reference currents $I_{REF5}$ and $I_{REF7}$ or $I_{REF1}$ and $I_{REF3}$ is to be used, and then, within the pair selected, which of the two reference currents is to be used.

In particular, the choice of which of the two reference currents $I_{REF5}$ and $I_{REF7}$ or $I_{REF1}$ and $I_{REF3}$ is to be used in the comparison is made using two two-way multiplexer stages 16 controlled by the comparator stage 14 which performs the second dichotomic step, and having a structure completely identical to that of the multiplexer stage 16 which makes the selection between the reference current $I_{REF6}$ and the reference current $I_{REF2}$, while the choice of which of the two pairs of reference currents $I_{REF5}$ and $I_{REF7}$ or $I_{REF1}$ and $I_{REF3}$ is to be used is made using a third two-way multiplexer stage 16 structure completely identical to the one which makes the selection between the reference current $I_{REF6}$ and the reference current $I_{REF2}$ not only for the fact of having a structure completely identical to that of the latter but also for the fact that it is controlled by the comparator stage 14 which performs the first dichotomic step.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A reading circuit for a non-volatile memory, comprising on asynchronous serial dichotomic reading device for reading the non-volatile memory.

2. The reading circuit of claim 1, wherein said comprises first comparator means having a first input receiving an electric quantity correlated to the current flowing in a multilevel memory cell, a second input receiving an electric quantity correlated to a first reference current, and an output supplying one of the bits stored in said multilevel memory cell; selection means having a selection input connected to the output of said first comparator means, a first signal input receiving an electric quantity correlated to a second reference current, a second signal input receiving an electric quantity correlated to a third reference current, and a signal output selectively connectable to one of said first and second signal inputs depending on the logic level present on said selection input; and second comparator means having a first input receiving said electric quantity correlated to the current flowing in said multilevel memory cell, a second input connected to the signal output of said selection means, and an output supplying another of the bits stored in said multilevel memory cell.

3. The reading circuit of claim 2, wherein said selection means comprise first switch means arranged between said first signal input and said signal output, and having a control terminal connected to said selection input, and second switch means arranged between said second signal input and said signal output, and having a control terminal connected to said selection input through inverting means, said inverting means having an input connected to said selection input and an output connected to the control terminal of said second switch means.

4. The reading circuit of claim 2 wherein said first reference current has an intermediate value between the values of said second and third reference currents.

5. The reading circuit of claim 2 wherein said first and second comparator means each comprise a double current mirror with a symmetrical active load.

6. The reading circuit of claim 5, wherein said double current mirror comprises four branches parallel-connected between a first line set at a first potential and a second line set at a second potential, and each formed by a first and a second transistor series-connected; the first transistors of said first and second branches having first terminals connected to said first line, second terminals connected to first terminals of the respective second transistors, and control terminals connected to each other and to one of the inputs of the comparator means; the second transistor of the first branch having a second terminal connected to said second line, and a control terminal connected to a control terminal of the second transistor of the third branch, and the second transistor of the second branch being diode-connected and having a second terminal connected to said second line, and a control terminal connected to its own first terminal and to the control terminal of the second transistor of the fourth branch; the first transistors of said third and fourth branches having first terminals connected to said first line, second terminals connected to first terminals of the respective second transistors, and control terminals connected to each other and to the other input of the comparator means; the second transistor of the third branch being diode-connected and having a second terminal connected to said second line, and a control terminal connected to its own first terminal and to the control terminal of the second transistor of the first branch, and the second transistor of the fourth branch having a first terminal connected to said second line, and a control terminal connected to a control terminal of the second transistor of the second branch.

7. The reading circuit of claim 6, wherein said first and second comparator means each further comprise a voltage comparator cascade-connected to said double current mirror.

8. The reading circuit of claim 7, wherein said voltage comparator comprises a differential input stage, and an output inverter stage.

9. A reading circuit for a non-volatile memory cell having at least one multi-level memory cell, the reading circuit comprising: an asynchronous serial dichotomic reading circuit that comprises a first comparator having a first input configured to receive an electric quantity correlated to a current flowing in the multi-level memory cell, a second input receiving an electric quantity correlated to a first reference current, and an output configured to supply one of the bits stored in the multi-level memory cell; a selection circuit having a selection input connected to the output of the first comparator, a first signal input configured to receive an electric quantity correlated to a second reference current, a second signal input configured to receive an electric quantity correlated to a third reference current, and a signal output that corresponds to one of the first and second signal inputs as controlled by a logic level on the selection input; and a second comparator having a first input configured to receive the electric quantity correlated to the current flowing in the multi-level memory cell, a second input connected to the signal output of the selection circuit, and an output configured to supply another of the bits stored in the multi-level memory cell.

10. A reading circuit for a non-volatile memory cell having at least one multi-level memory cell, the reading circuit comprising: an asynchronous serial dichotomic reading circuit that comprises a first comparator having a first input configured to receive an electric quantity correlated to a current flowing in the multi-level memory cell, a second input receiving an electric quantity correlated to a first reference current, and an output configured to supply one of the bits stored in the multi-level memory cell; a selection circuit having a selection input connected to the output of the first comparator, a first signal input configured to receive an electric quantity correlated to a second reference current, a second signal input configured to receive an electric quantity correlated to a third reference current, and a signal output that corresponds to one of the first and second signal inputs as controlled by a logic level on the selection input; and a second comparator having a first input configured to receive the electric quantity correlated to the current flowing in the multi-level memory cell, a second input connected to the signal output of the selection circuit, and an output configured to supply another of the bits stored in the multi-level memory cell;

the selection circuit comprising a first switch arranged between the first signal input and the signal output and having a control terminal connected to the selection input, a second switch arranged between the second signal input and the signal output and having a control terminal connected to the selection input through an inverter, the inverter having an input connected to the selection input and an output connected to the control terminal of the second switch.

11. A reading circuit for a non-volatile memory cell having at least one multi-level memory cell, the reading circuit comprising: an asynchronous serial dichotomic reading circuit that comprises a first comparator having a first input configured to receive an electric quantity correlated to a current flowing in the multi-level memory cell, a second input receiving an electric quantity correlated to a first reference current, and an output configured to supply one of the bits stored in the multi-level memory cell; a selection circuit having a selection input connected to the output of the first comparator, a first signal input configured to receive an electric quantity correlated to a second reference current, a second signal input configured to receive an electric quantity correlated to a third reference current, and a signal output that corresponds to one of the first and second signal inputs as controlled by a logic level on the selection input; and a second comparator having a first input configured to receive the electric quantity correlated to the current flowing in the multi-level memory cell, a second input connected to the signal output of the selection circuit, and an output configured to supply another of the bits stored in the multi-level memory cell;

the selection circuit comprising a first switch arranged between the first signal input and the signal output and having a control terminal connected to the selection input, a second switch arranged between the second signal input and the signal output and having a control terminal connected to the selection input through an inverter, the inverter having an input connected to the selection input and an output connected to the control terminal of the second switch; and the first and second comparators comprising a double current mirror that includes four branches parallel-connected between a first line set at a first potential and a second line set at a second potential, and each formed by a first transistor and a second transistor that are series-connected together, the first transistors of the first and second branches having first terminals connected to the first line, second terminals connected to the first terminals of the respective second transistors, and control terminals connected to each other and to one of the inputs of the comparators; the second transistor of the first branch having a second terminal connected to the second line and a control terminal connected to a control terminal of the second transistor of the third branch, and a second transistor of the second branch diode-connected between a second terminal connected to the second line and a control terminal connected to its own first terminal and to the control terminal of the second transistor of the fourth branch; the first transistors of the third and fourth branches having first terminals connected to the first line, second terminals connected to first terminals of the respective second transistors, and control terminals connected to each other and to the other input of the comparator; the second transistor of the third branch diode-connected and having a second terminal connected to the second line, and a control terminal connected to its own first terminal and to the control terminal of the second transistor of the first branch; and the second transistor of the fourth branch having a first terminal connected to the second line, and a control terminal connected to a control terminal of the second transistor of the second branch.

12. A reading circuit for a multi-level non-volatile memory, comprising:

a first comparator circuit having an inverting input coupled to a first current reference and a non-inverting input coupled to the non-volatile multi-level memory cells, and an output;

a first selection circuit coupled to the output of the first comparator and coupled to a second reference current and to a third reference current and having an output;

a second comparator having an inverting input coupled to the output of the first selection circuit, a non-inverting input coupled to the multi-level non-volatile memory cell, and an output; a second selection circuit coupled to the output of the first comparator and to the output of the second comparator and having an output; and a third comparator having an inverting input coupled to the output of the second selection circuit and a non-inverting input coupled to the multi-level non-volatile memory cell.

13. The reading circuit of claim 12, wherein the second selection circuit is coupled to fourth, fifth, sixth, and seventh current references via first, second, third, and fourth pass transistors, respectively.

14. A reading circuit for a multi-level memory cell, comprising:

a first comparator having a first input coupled to the non-volatile memory cell and a second input coupled to a reference current source, and the first comparator configured to generate an output signal on an output corresponding to the value of a first bit stored in the multilevel non-volatile memory cell;

a selection circuit having a first input coupled to the output of the first comparator, a second input coupled to a second reference current source and a third input coupled to a third reference current source, the selection circuit configured to output on a selection output one of either the second and third reference currents in response to the value of the output from the first comparator; and a second comparator having a first input coupled to the output of the first selection circuit and a second input coupled to the multi-level non-volatile memory cell, the second comparator configured to output on an output of the second comparator an output signal corresponding to another bit of the multi-level non-volatile memory cell.

15. The reading circuit of claim 14, wherein the first selection circuit comprises a first transistor having a control gate coupled to the output of the first comparator, a first terminal coupled to the second reference current source and a third terminal coupled to the input of the second comparator, an inverter having an input coupled to the control terminal of the first transistor and an output coupled to a control terminal of a second transistor, the second transistor having a first terminal coupled to the second terminal of the first transistor and a second terminal coupled to the third current source.

* * * * *

UNITED STATES PATENT AND TRADEMARK OFFICE
CERTIFICATE OF CORRECTION

PATENT NO. : 6,657,895 B2  Page 1 of 1
DATED : December 2, 2003
INVENTOR(S) : Mauro Pagliato et al.

It is certified that error appears in the above-identified patent and that said Letters Patent is hereby corrected as shown below:

Column 10,
Line 18, after "memory" insert -- , wherein said asynchronous serial dichomatic reading device comprises a first comparator means, a selection means and a second comparator means operatively coupled together. --

Column 14,
Line 4, "multilevel" should read as -- multi-level --.

Signed and Sealed this

Thirtieth Day of March, 2004

JON W. DUDAS
*Acting Director of the United States Patent and Trademark Office*